(12) United States Patent
Liang et al.

(10) Patent No.: US 7,667,497 B2
(45) Date of Patent: Feb. 23, 2010

(54) PROCESS VARIATION TOLERANT CIRCUIT WITH VOLTAGE INTERPOLATION AND VARIABLE LATENCY

(75) Inventors: Xiaoyao Liang, Cambridge, MA (US); David Brooks, Cambridge, MA (US); Gu-Yeon Wei, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 12/261,771

(22) Filed: Oct. 30, 2008

(65) Prior Publication Data

US 2009/0134707 A1 May 28, 2009

Related U.S. Application Data

(60) Provisional application No. 60/983,751, filed on Oct. 30, 2007.

(51) Int. Cl.
*H03K 19/00* (2006.01)
(52) U.S. Cl. .......................................... 326/93; 326/33
(58) Field of Classification Search ................... 326/93, 326/95, 96, 33
See application file for complete search history.

(56) References Cited

U.S. PATENT DOCUMENTS

| | | | | |
|---|---|---|---|---|
| 6,958,627 | B2 * | 10/2005 | Singh et al. | 326/93 |
| 7,511,535 | B2 * | 3/2009 | Chakraborty et al. | 326/93 |
| 7,587,698 | B1 * | 9/2009 | Rohe et al. | 716/16 |
| 2005/0253462 | A1 | 11/2005 | Falkowski et al. | |
| 2006/0171477 | A1 | 8/2006 | Carballo et al. | |
| 2006/0172715 | A1 | 8/2006 | Carballo et al. | |
| 2007/0046323 | A1 | 3/2007 | Kuang et al. | |
| 2007/0047364 | A1 | 3/2007 | Chuang et al. | |
| 2007/0200593 | A1 | 8/2007 | Agarwal et al. | |
| 2007/0216457 | A1 | 9/2007 | Agarwal et al. | |

OTHER PUBLICATIONS

K. Bernstein, et al., "High-performance CMOS variability in the 65-nm regime and beyond," IBM J. Res. & Dev. Vo. 50 No. 4/5 (Jul./Sep. 2006).

(Continued)

*Primary Examiner*—James Cho
(74) *Attorney, Agent, or Firm*—24IP Law Group; Timothy R. DeWitt

(57) ABSTRACT

A circuit having dynamically controllable power. The circuit comprises a plurality of pipelined stages, each of the pipelined stages comprising two clocking domains, a plurality of switching circuits, each switching circuit being connected to one of the pipelined stages, first and second power sources connected to each of the plurality of pipelined stages through the switching circuits, the first power source supplying a first voltage and the second power source supplying a second voltage, wherein the first and second power sources each may be applied to a pipelined stage independently of other pipelined stages, first and second complementary clocks, and a plurality of latches connected to the first and second complementary clocks and to the plurality of pipelined stages for proving latch-based clocking to control the first and second clocking domains and to enable time-borrowing across the plurality of switching circuits. The first voltage differs from the second voltage and the plurality of pipelined stages interpolates between the first and second voltages to provide differing effective voltages between the first and second voltages.

10 Claims, 6 Drawing Sheets

OTHER PUBLICATIONS

Borkar, S., "Tackling variability and reliability challenges," IEEE Design & Test of Computers (2006).

Tran, C. Q., Kawaguchi, H. and Sakurai, T., "95% Leakage-Reduced FPGA using Zigzag Power-grating, Dual-VTH/VDD and Micro-VDD-Hopping," IEEE (2005).

Agarwal, K. and Nowka, K., "Dynamic Power Management by Combination of Dual Static Supply Voltages," Proceedings of the 8th Int'l Symposium on Quality Electronic Design (ISQED'07)(2007).

Borkar, S., "Designing Reliable Systems from Unreliable Components: The Challenges of Transistor Variability and Degredation," IEEE 2005.

* cited by examiner

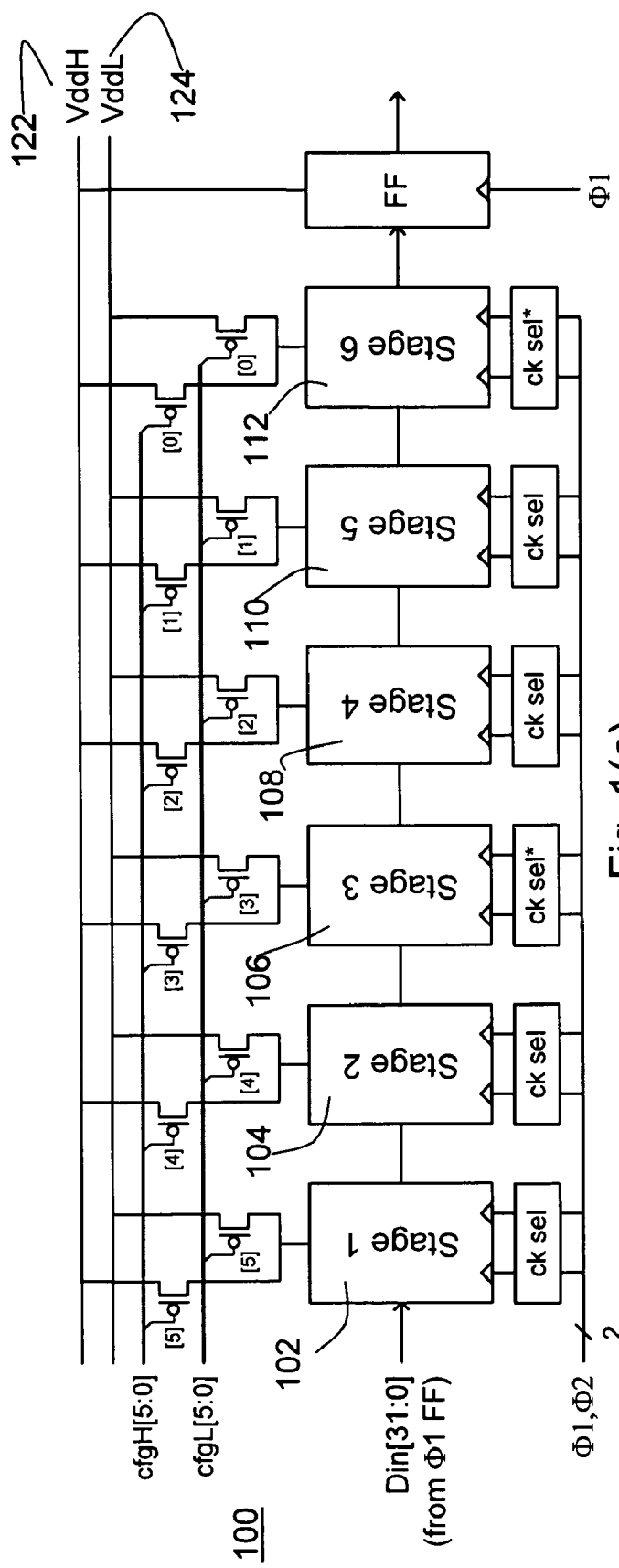
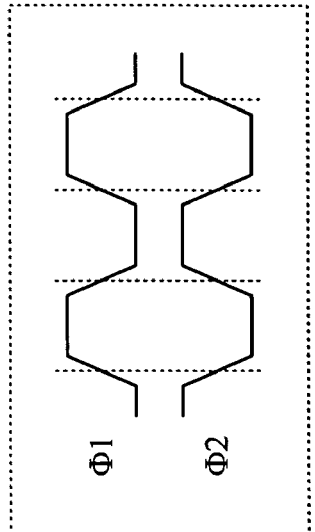
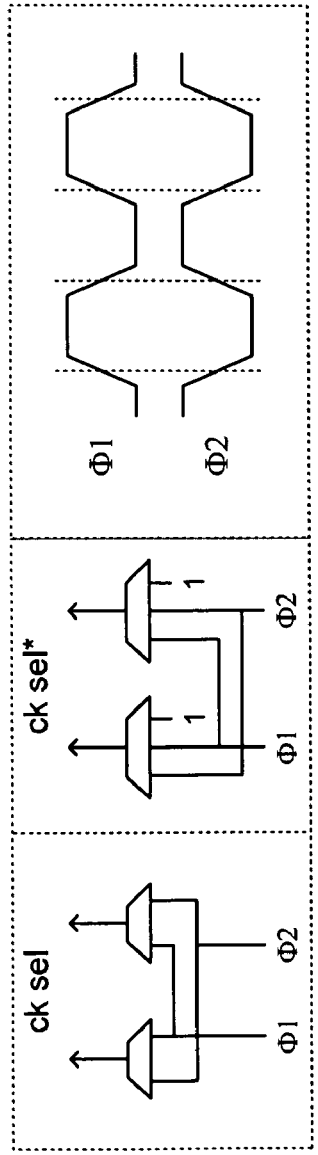
Fig. 1(a)
Fig. 1(b)
Fig. 1(c)
Fig. 1(d)

PROCESS VARIATION TOLERANT CIRCUIT WITH VOLTAGE INTERPOLATION AND VARIABLE LATENCY

CROSS-REFERENCE TO RELATED APPLICATIONS

The present application claims the benefit of the filing date of U.S. Provisional Patent Application Ser. No. 60/983,751 filed by the present inventors on Oct. 30, 2007.

The aforementioned provisional patent application is hereby incorporated by reference in its entirety.

STATEMENT REGARDING FEDERALLY SPONSORED RESEARCH OR DEVELOPMENT

This invention was made with government support under 0429782 awarded by the National Science Foundation. The government has certain rights in the invention.

BACKGROUND OF THE INVENTION

1. Field of the Invention

The present invention relates generally to digital processing circuits, and more specifically to post-fabrication tuning techniques for logic components.

2. Brief Description of the Related Art

Process variation will greatly impact the power and performance of future microprocessors. Design approaches based on multiple supply or threshold voltage assignment provide techniques to statically tune critical path delays for energy savings. One such approach has been referred to as "clustered voltage scaling." See K. Usami, M. Horowitz, "Clustered Voltage Scaling Technique for Low-Power Design," Proceedings of the International Workshop on Low Power Design, pp. 3-8, April 1995 and L. Wei, Z. Chen, K. Roy, M. Johnson, Y. Ye, V. De, "Design and optimization of dual-threshold circuits for low-voltage low-power applications," IEEE Transactions on Very Large Scale Integration (VLSI) Systems, pp. 16-24, March 1999. Because clustered voltage scaling techniques are not dynamic, they cannot adapt power consumption to resource demand. Since the clustered voltage scaling systems assign different voltages at the time of design, they place higher supply voltages on circuits requiring higher performance and lower supply voltages on circuits requiring only lower performance. Further, under process variation, delay of critical paths may vary, and the large number of critical paths in circuits can reduce the maximum operating frequency of pipelined processors. See K. A. Bowman, Steven G. Duvall, and J. D. Meindl, "Impact of Die-to-Die and Within-Die Parameter Fluctuations on the Maximum Clock Frequency Distribution for Gigascale Integration," IEEE Journal of Solid-State Circuits, pp. 183-190, February 2002.

One proposed post-fabrication solution is to adaptively tune the back-body bias to combat variations for logic structures. J. Tschanz, J. Kao, S. Narendra, R. Nair, D. Antoniadis, A. Chandrakasan, and V. De, "Adaptive Body Bias for Reducing Impacts of Die-to-Die and Within-Die Parameter Variations on Microprocessor Frequency and Leakage," in IEEE ISSCC Dig. Tech. Papers, pp. 422-423, February 2002. Dual-voltage operation has also been proposed to enable robust memory operation under variations. J. Pille, C. Adams, T. Christensen, S. Cottier, S. Ehrenreich, F. Kono, D. Nelson, O. Takahashi, S. Tokito, O. Torreiter, O. Wagner, D. Wendel, "Implementation of the CELL Broadband Engine in a 65 nm SOI Technology Featuring Dual-Supply SRAM Arrays Supporting 6 GHz at 1.3V," in ISSCC 2007 Dig. Tech Papers, pp. 322-323, February 2007.

Another approach was disclosed in U.S. Patent Application Publication US2005/0253462, entitled "Integrated Circuit with Multiple Power Domains" and filed on Feb. 7, 2005. Additionally, in U.S. Patent Application Publication No. US2007/0200593, entitled "Digital Circuit with Dynamic Power and Performance Control via Per-Block Selectable Operating Voltage" and filed on Dec. 13, 2005, a digital circuit with dynamic power and performance control via per-block selectable operating voltage level is proposed to permit dynamic tailoring of operating power to processing demand and/or compensation for processing variation.

SUMMARY OF THE INVENTION

In a preferred embodiment, the present invention is a post-fabrication tuning technique. The technique, which may comprise voltage interpolation and variable latency, covers greater than 30% of delay variations for a 6-stage pipelined floating point unit, or "FPU," fabricated in 130 nm Logic CMOS. Results show frequency variations across 15 measured chips can be reduced to a single median frequency.

In a preferred embodiment, the present invention is a circuit having dynamically controllable power. The circuit comprises a plurality of pipelined stages, each of the pipelined stages comprising two clocking domains, a plurality of switching circuits, each switching circuit being connected to one of the pipelined stages, first and second power sources connected to each of the plurality of pipelined stages through the switching circuits, the first power source supplying a first voltage and the second power source supplying a second voltage, wherein the first and second power sources each may be applied to a pipelined stage independently of other pipelined stages, first and second complementary clocks, and a plurality of latches connected to the first and second complementary clocks and to the plurality of pipelined stages for proving latch-based clocking to control the first and second clocking domains and to enable time-borrowing across the plurality of pipelined stages. The first voltage differs from the second voltage and the plurality of pipelined stages interpolates between the first and second voltages to provide differing effective voltages across the plurality of pipelined stages. The plurality of pipelined stages may comprise, for example, six pipelined stages. The circuit may operate in first and second modes, the first mode having a number of stages equal to the number of the plurality of stages and the second mode having an additional stage formed by an extra latch connected to a middle stage and another extra latch connected to an end stage, wherein in the first most the additional latches let data flow through and in the second mode the extra latches form an additional stage.

In another preferred embodiment, some or all of the pipelined stages of the circuit each comprise a plurality of logic stages, and wherein the first and second power sources each may be applied to each logic stage independently of other logic stages. The plurality of latches to provide latch-based clocking to enable time-borrowing across the plurality of logic stages. The first voltage differs from the second voltage and the plurality of logic stages within one pipelined stage may interpolate between the first and second voltages to provide differing effective voltages across that pipelined stage. The plurality of logic stages within one or all pipelined stages interpolate between the first and second voltages to provide differing effective voltages across the plurality of logic stages within each pipelined stage.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 1(a) is a block diagram of a pipelined FPU with per-stage Vdd and clock selection circuitry in accordance with a preferred embodiment of the present invention.

FIG. 1(b) is a diagram of a clocking scheme in accordance with a preferred embodiment of the present invention for the pipelined FPU shown in FIG. 1(a).

FIGS. 1(c) and (d) are diagrams of latch-based clocking in accordance with a preferred embodiment of the present invention.

DETAILED DESCRIPTION OF THE PREFERRED EMBODIMENTS

The present invention of a combination of two fine-grain, post-fabrication circuit-tuning techniques for pipelined logic components - - - voltage interpolation and variable latency - - - is described with reference to FIGS. 1-6. The combination of techniques provides circuit flexibility for adapting to different degrees of process variation. As an exemplary embodiment, these techniques are applied to a single-precision floating-point unit ("FPU") designed using a standard CAD synthesis flow in a 130 nm CMOS logic process with 8 metal layers. Measured results from fabricated chips show that both techniques can provide wide frequency tuning range to deal with frequency fluctuations arising from process variations with minimal power overhead, and in some configurations, power savings.

Figure 2:
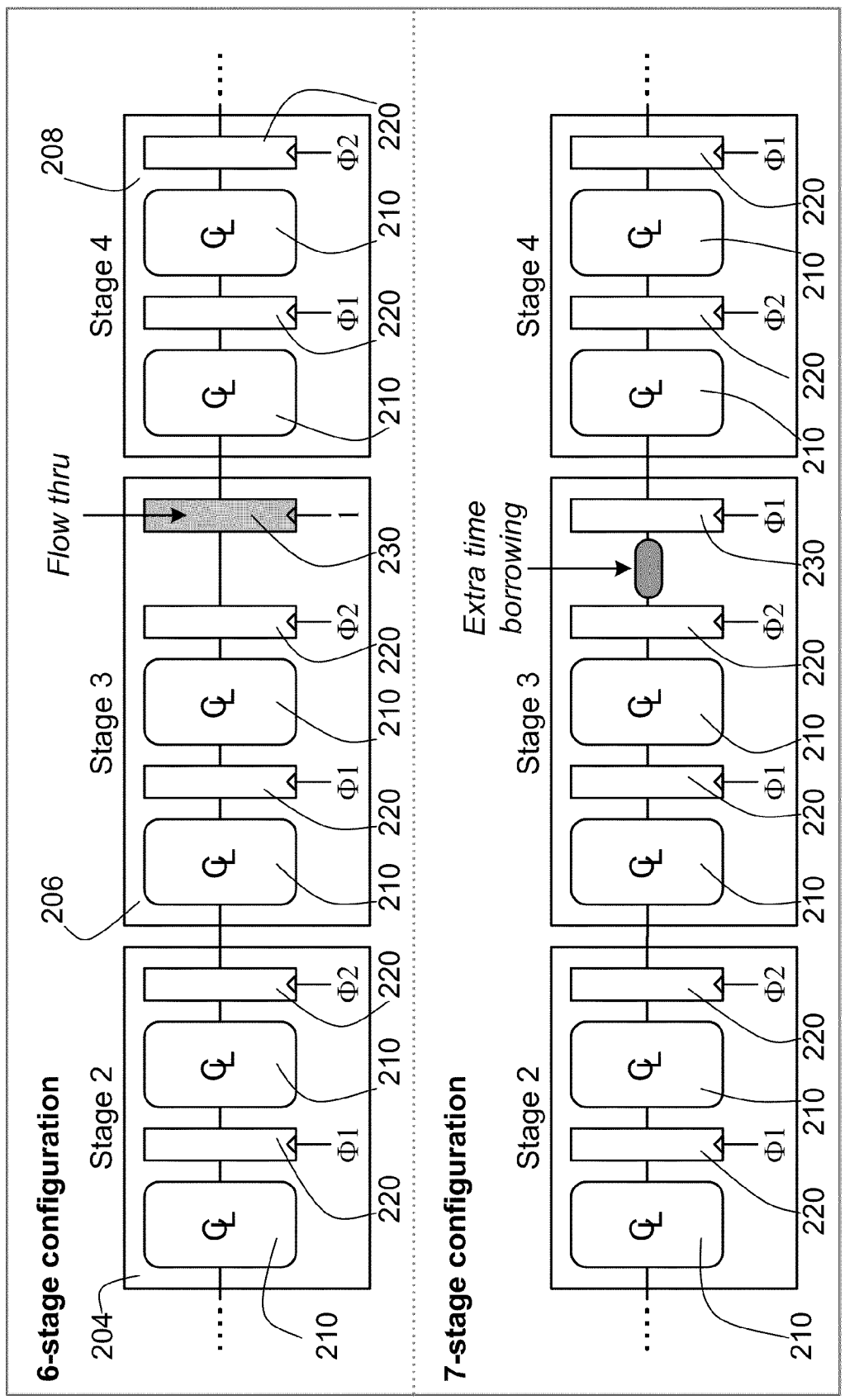
FIG. 2 shows variable latency clocking schemes for 6-stage and 7-stage configurations in accordance with a preferred embodiment of the present invention. The schemes illustrate extra time borrowing for the 7-stage configuration. Only three of the stages are shown for each.

FIG. 1(a) shows the circuit architecture of a preferred embodiment of the present invention. The FPU 100 is pipelined into 6 stages 102, . . . , 112, with two power supplies 122, 124 (VddH, VddL) provided across the unit 100. Each pipeline stage 102, . . . , 112, can choose one of the two voltages 122, 124 independently, resulting in 64 different voltage configurations. By interpolating between two voltages 122, 124 with these configurations, different "effective voltages," somewhere between VddH and VddL, can be obtained for the entire pipeline, providing a broad spectrum of frequency tunability. FIG. 1(b) shows a preferred clocking scheme for the preferred embodiment shown in FIG. 1(a). Each pipeline stage is divided into two clocking domains, controlled by complementary clocks (Φ1, Φ2). Latch-based clocking, shown in FIGS. 1(c) and (d), enables time borrowing across pipeline stages. To increase borrowing, an additional stage can be introduced by adding one extra latch in the middle (stage3) and at the end (stage6) of the pipeline. The additional latency can often be tolerated at the system-level, given that certain microprocessor units may not be latency-critical. As shown in FIG. 2, each stage 204, 206, 208 comprises combinational logic 210 and latches 220. The third stage 206 comprises an extra latch 230. When the system is configured for the 6-stage mode, the extra latch 230 lets data flow thru. In the 7-stage mode, the extra latch 230 is connected to the pipeline, thereby providing an extra half-cycle of time for computation to occur in the preceding combinational logic. By providing an extra latch in a middle stage such as the third stage in the preferred embodiment and in a later or last stage, and the two extra latches effectively form an extra stage. This extra stage is purely used for time borrowing and adds almost one cycle of timing slack into the pipeline. Clock selection circuits feed each latch with the proper clock phase as shown in FIG. 2.

Figure 3:
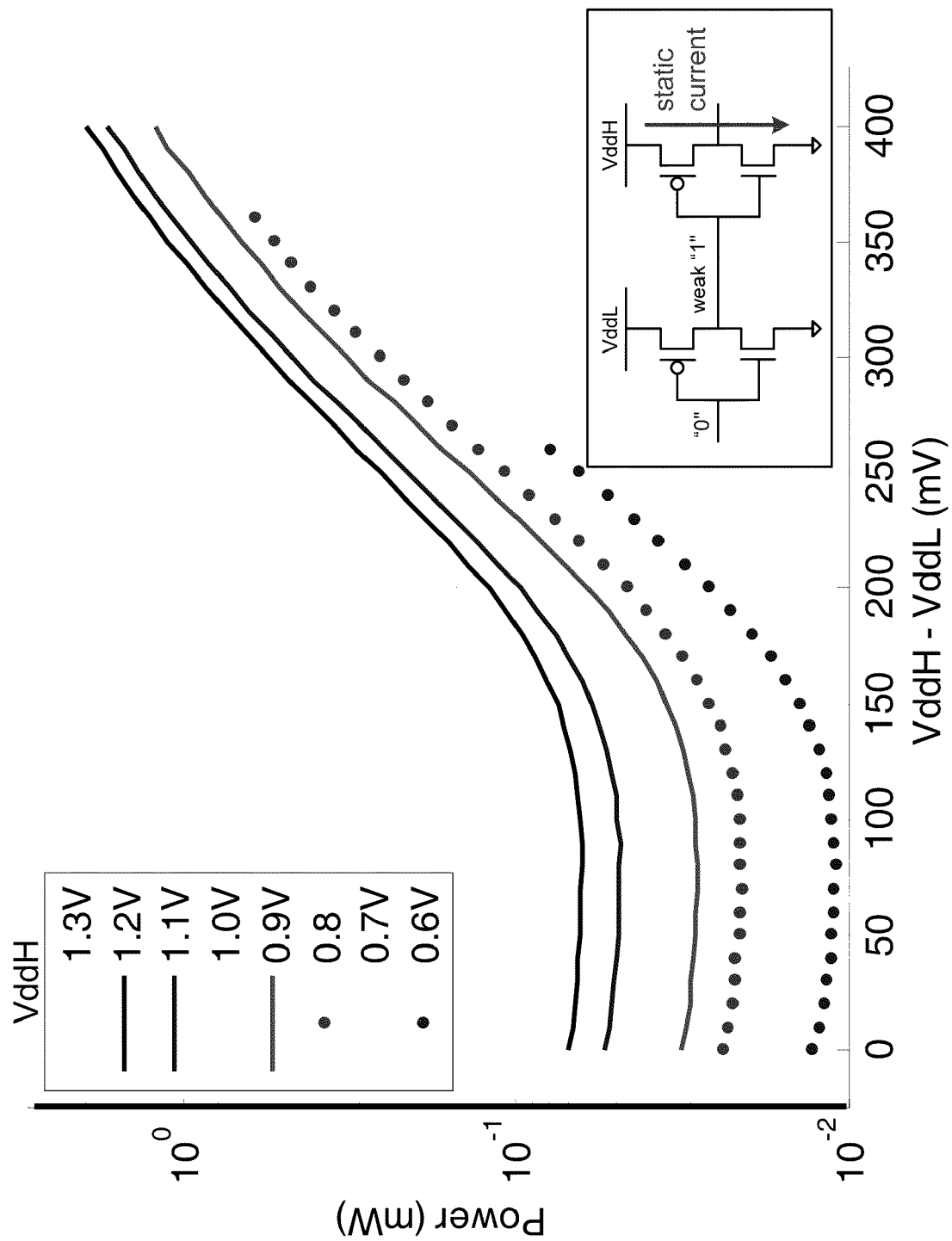
FIG. 3 is a graph of static power vs. delta V vs. VddH settings for worst case voltage interpolation setting in a chip in accordance with a preferred embodiment of the present invention. Data points corresponding to inoperable voltage settings are omitted.

With two supply voltages, one concern is the potential for increased static current at the voltage domain boundaries. If a VddL stage drives a VddH stage, the interface PMOS transistors connected to the VddH domain will not fully shut off, resulting in short-circuit current. FIG. 3 shows measured static power for the chip when set to a worst-case voltage configuration to highlight this problem. The amount of short-circuit power depends on ΔV, as well as VddH. For ΔV less then 200 mV (less than Vtp), the increase in static power is negligible, and dominated by leakage. Results later show that ΔV=200 mV is sufficient to enable wide-range frequency tuning that can cover >30% of delay variation. Hence, the design can avoid using level shifters and incurring associated overheads. At low voltages and large ΔV settings, circuit operation fails.

Figures 4A, 4B:
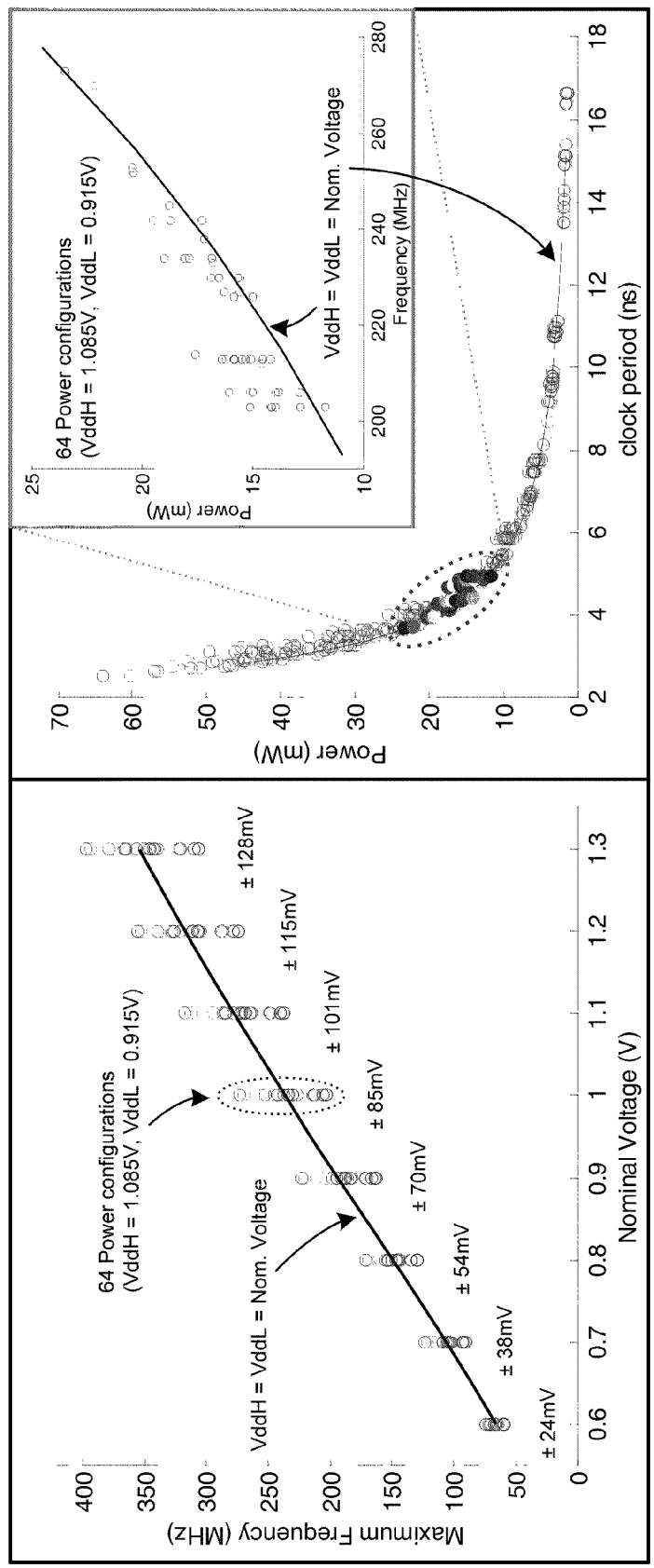
FIG. 4(a) is a graph illustrating maximum frequency vs. voltage with interpolation for a 6-stage pipeline in accordance with a preferred embodiment of the present invention.
FIG. 4(b) is a graph illustrating power vs. clock period with voltage interpolation in accordance with a preferred embodiment of the present invention.

FIGS. 4(a) and (b) show the measured results of voltage interpolation for the 6-stage pipeline with respect to frequency tuning and power, respectively. FIGS. 4(a) and (b) compare the present invention to a configuration (dark line) with a single power supply set to the nominal voltage. The voltage-interpolated configurations use two power supplies: VddH=VddNom+ΔV/2 and VddL=VddNom−ΔV/2. In FIG. 4(a), the max frequencies measured for all voltage configurations are overlaid onto the nominal frequency vs. voltage curve. Voltage interpolation provides a well-distributed frequency tuning range about the nominal frequencies. This tuning range depends on the selection of ΔV and the nominal voltage. By linearly scaling ΔV with respect to nominal voltage, ~30% frequency tuning range can be achieved across all nominal voltage levels. FIG. 4(b) plots the measured power-delay curve for the 6-stage pipeline mode. The different voltage interpolation configurations scatter on this curve, demonstrating voltage interpolation incurs little energy overhead. The zoomed-in region of the plot shows that some voltage configurations can achieve equivalent frequency with lower power.

Figure 5:
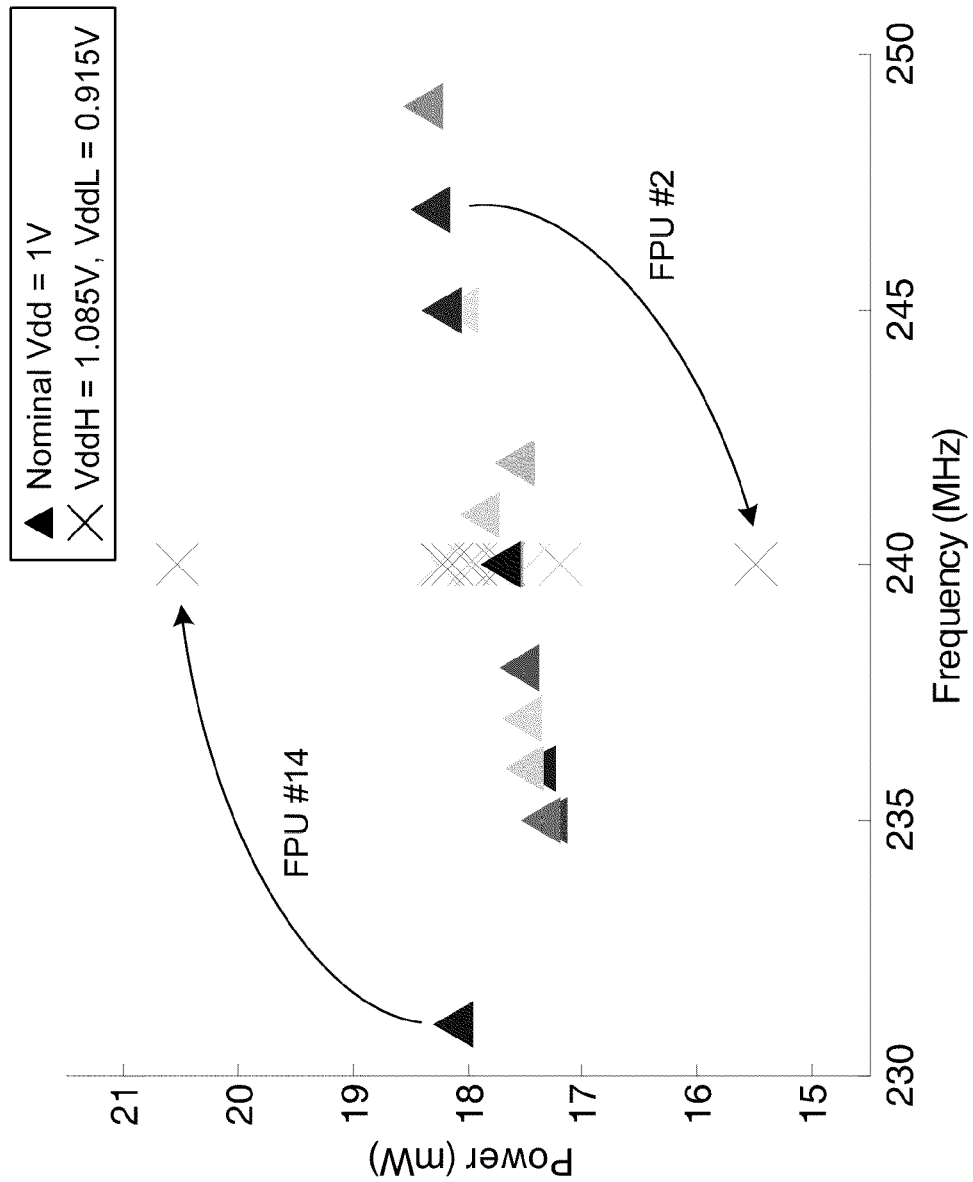
FIG. 5 is a graph of reduction of FPU frequency variability via voltage interpolation shown for 15 exemplary FPUs. FPU #14 achieves higher frequency at the expense of higher power, while FPU #2 trades extra performance for power savings.

FIG. 5 shows the effectiveness of voltage interpolation to combat variability across 15 test chips. The measured max frequency and power of each FPU chip using a single 1V supply is plotted and shows frequency and power variations around a 240 MHz median frequency. With voltage interpolation, all FPUs use the same VddH (1.085V) and VddL (0.915V), and the plot shows all FPUs can be binned to the median frequency, using the voltage configuration that minimizes power for each case. The slowest FPU (#14) can be sped up at the expense of higher power (3 stages connected to VddH). A faster FPU (#2) can trade frequency for reduction in power (1 stage connected to VddH). These results show that voltage interpolation can be an effective performance-tuning knob to combat process variation.

Figure 6:
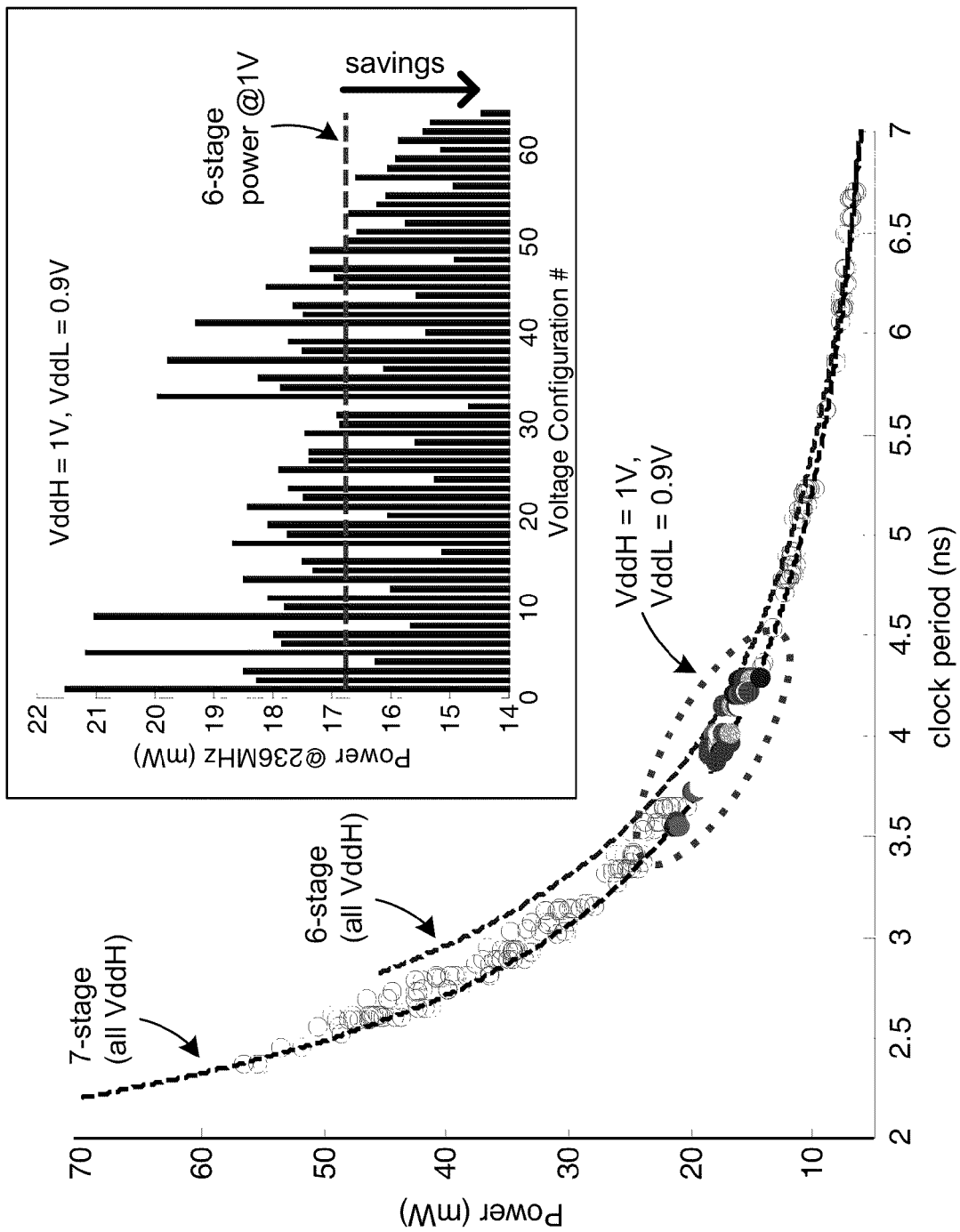
FIG. 6 is a graph of power vs. clock period for all 7 stage voltage configurations across multiple voltage settings. Power savings is shown for variable latency (7 stages) with voltage interpolation.

Variable-latency operation can mitigate effects of process variation or save energy when combined with voltage interpolation. If delay variation causes the 6-stage FPU to not meet timing, we can extend to a 7-stage pipelined FPU providing 17% additional frequency headroom. Adding one cycle latency may not incur much performance penalty at the system-level, but can help meet frequency targets. This additional headroom also offers power savings. FIG. 6 shows the measured power-delay space for 7-stage FPUs with voltage interpolation, and compares to 6-stage and 7-stage configurations with a single nominal voltage in dashed lines. To achieve the same delay, the 7-stage pipeline consumes less power, and the voltage-interpolated configurations again scatter close to the nominal 7-stage power-delay curve. Thus, combining variable latency with voltage interpolation can save power when compared to a 6-stage pipeline with the same frequency. The subfigure shows the measured power across the 64 voltage configurations. Compared with the 6-stage FPU fixed at 1V, configuration #64 saves 10% of power. Voltage interpolation offers fine-grain "effective voltage" tuning with two supply voltages. This tunability is important for variation-tolerant design since different units on the same chip can have localized worst-case operating frequencies that deviate from the nominal.

Voltage interpolation has significant advantages over traditional voltage-frequency binning, which can only cover coarse-grain variations. The measured FPU test chips demonstrate that voltage interpolation and variable latency schemes offer block-level control of circuit delays to cover fine-grain variations with power efficiency.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

The invention claimed is:

1. A circuit having dynamically controllable power, comprising:
a plurality of pipelined stages, each of said pipelined stages comprising two clocking domains;
a plurality of switching circuits, each switching circuit being connected to one of said pipelined stages;
first and second power sources connected to each of said plurality of pipelined stages through said switching circuits, said first power source supplying a first voltage and said second power source supplying a second voltage, wherein said first and second power sources each may be applied to a pipelined stage independently of other pipelined stages;
first and second complementary clocks; and
a plurality of latches connected to said first and second complementary clocks and to said plurality of pipelined stages for proving latch-based clocking to control said first and second clocking domains and to enable time-borrowing across said plurality of pipelined stages.

2. A circuit having dynamically controllable power according to claim 1 where, wherein said first voltage differs from said second voltage and said plurality of pipelined stages interpolates between said first and second voltages to provide differing effective voltages across said plurality of pipelined stages.

3. A circuit having dynamically controllable power according to claim 1, wherein one of said plurality of pipelined stages comprises a plurality of logic stages, and wherein said first and second power sources each may be applied to each logic stage independently of other logic stages.

4. A circuit having dynamically controllable power according to claim 3, wherein said plurality of latches provide latch-based clocking to control said first and second clocking domains and to enable time-borrowing across said plurality of logic stages.

5. A circuit having dynamically controllable power according to claim 3 wherein said plurality of logic stages within one pipelined stage interpolate between said first and second voltages to provide differing effective voltages across said plurality of logic stages within that one pipelined stage.

6. A circuit having dynamically controllable power according to claim 1, wherein each of said plurality of pipelined stages comprises a plurality of logic stages, each logic stage comprising said first and second clocking domains.

7. A circuit having dynamically controllable power according to claim 6, wherein said plurality of latches provide latch-based clocking to control said first and second clocking domains and to enable time-borrowing across said plurality of logic stages.

8. A circuit having dynamically controllable power according to claim 1 wherein said plurality of logic stages within each pipelined stage interpolate between said first and second voltages to provide differing effective voltages across each pipelined stage.

9. A circuit having dynamically controllable power according to claim 1, wherein said plurality of pipelined stages comprises six pipelined stages.

10. A circuit having dynamically controllable power according to claim 1, wherein said circuit operates in first and second modes, said first mode having a number of stages equal to the number of said plurality of stages and said second mode having an additional stage formed by an extra latch connected to a middle stage and another extra latch connected to an end stage, wherein in said first mode said additional latches let data flow through and in said second mode said extra latches form an additional stage.

* * * * *